US008669164B2

(12) United States Patent
Maxwell et al.

(10) Patent No.: US 8,669,164 B2
(45) Date of Patent: Mar. 11, 2014

(54) METHOD OF FABRICATING FREE-FORM, HIGH-ASPECT RATIO COMPONENTS FOR HIGH-CURRENT, HIGH-SPEED MICROELECTRONICS

(75) Inventors: James L. Maxwell, Jemez Springs, NM (US); Chris R. Rose, Los Alamos, NM (US); Marcie R. Black, Lincoln, MA (US); Robert W. Springer, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 479 days.

(21) Appl. No.: 12/753,682

(22) Filed: Apr. 2, 2010

(65) Prior Publication Data
US 2010/0289060 A1   Nov. 18, 2010

Related U.S. Application Data

(60) Provisional application No. 61/211,839, filed on Apr. 3, 2009.

(51) Int. Cl.
*H01L 21/205* (2006.01)
*H01L 21/365* (2006.01)
*C01B 33/02* (2006.01)
*C01B 35/00* (2006.01)

(52) U.S. Cl.
USPC ...... 438/381; 438/478; 204/157.45; 204/164; 257/E21.016; 257/E21.019; 257/E21.101

(58) Field of Classification Search
USPC .................. 204/157.4–157.52, 164; 257/E21.014–E21.02, 257/E21.101–E21.113; 438/381, 400, 406
See application file for complete search history.

(56) References Cited

U.S. PATENT DOCUMENTS 5,786,023 A * 7/1998 Maxwell et al. ............... 427/8
2006/0275537 A1 * 12/2006 Maxwell et al. ............... 427/8

OTHER PUBLICATIONS

Björklund, K. L., et al. "Containerless fabrication of tungsten single crystals using laser CVD for field emission applications." Applied Physics A 75.4 (2002): 493-496.*

* cited by examiner

*Primary Examiner* — Ha Tran T Nguyen
*Assistant Examiner* — Raj R Gupta
(74) *Attorney, Agent, or Firm* — Ryan B. Kennedy

(57) ABSTRACT

Microelectronic structures and devices, and method of fabricating a three-dimensional microelectronic structure is provided, comprising passing a first precursor material for a selected three-dimensional microelectronic structure into a reaction chamber at temperatures sufficient to maintain said precursor material in a predominantly gaseous state; maintaining said reaction chamber under sufficient pressures to enhance formation of a first portion of said three-dimensional microelectronic structure; applying an electric field between an electrode and said microelectronic structure at a desired point under conditions whereat said first portion of a selected three-dimensional microelectronic structure is formed from said first precursor material; positionally adjusting either said formed three-dimensional microelectronic structure or said electrode whereby further controlled growth of said three-dimensional microelectronic structure occurs; passing a second precursor material for a selected three-dimensional microelectronic structure into a reaction chamber at temperatures sufficient to maintain said precursor material in a predominantly gaseous state; maintaining said reaction chamber under sufficient pressures whereby a second portion of said three-dimensional microelectronic structure formation is enhanced; applying an electric field between an electrode and said microelectronic structure at a desired point under conditions whereat said second portion of a selected three-dimensional microelectronic structure is formed from said second precursor material; and, positionally adjusting either said formed three-dimensional microelectronic structure or said electrode whereby further controlled growth of said three-dimensional microelectronic structure occurs.

23 Claims, 5 Drawing Sheets

METHOD OF FABRICATING FREE-FORM, HIGH-ASPECT RATIO COMPONENTS FOR HIGH-CURRENT, HIGH-SPEED MICROELECTRONICS

CROSS REFERENCE TO RELATED APPLICATION

This application claims the benefit of priority of U.S. Provisional Patent Application 61/211,839, filed Apr. 3, 2009, and incorporated herein in its entirety.

STATEMENT REGARDING FEDERAL RIGHTS

This invention was made with government support under Contract No. DE-AC 52-06NA25396, awarded by the U.S. Department of Energy. The government has certain rights in the invention.

FIELD OF THE INVENTION

The invention relates to three-dimensional microelectronic structures and processes for growth thereof employing field emission laser chemical vapor deposition (FE-LCVD) and field emission high pressure (hyperbaric) laser chemical vapor deposition (FE-HP-LCVD).

BACKGROUND OF THE INVENTION

Microelectronic fabrication technology is an extremely diverse field, ranging from the fabrication of discrete custom-made components to on-chip digital/analog circuits with their associated higher-level packaging. However, most of the devices that form the basis of modern microelectronics are fabricated using a single basic approach, namely, by application of UV optical photolithography whereby a pattern is transferred from a "mask" (template) to a photosensitive polymer (photoresist). Once the pattern is developed in the photoresist, it can be used to allow selective deposition, etching or implantation of materials into or over the supporting substrate.

The key disadvantage of this technology is that roughly all the devices are created within a single plane and are surrounded by a supporting material, i.e., the substrate. Thus, the current technology is two-dimensional in nature, and results in many limitations on performance. For example, the source/drain capacitance limits the switching speed in a transistor. This capacitance can be eliminated by designing the transistor in three dimensions. Another limitation that can be eased by three-dimensional device design is heat dissipation. The thermophysical properties of the substrate in two-dimensional structures limit the rate at which heat can be dissipated from a device, which, in turn, limits the amount of current a device can control. Using 3-D wires as the collector, emitter and base, for example, 3-D transistors of related solid-state devices can be created. Finally, three-dimensional structures would result in the elimination of field oxide in a metal-oxide-semiconductor (MOS) circuit. Thus, both data electronics and power electronics would benefit from an economical and efficient process of making three-dimensional components.

SUMMARY OF THE INVENTION

The method of the present invention employs the use of field-emission laser chemical vapor deposition (FE-LCVD), or alternatively, field-emission high-pressure laser chemical vapor deposition (FE-HP-LCVD) to form three-dimensional microelectronics components and systems. During these processes, fibers are grown by focusing an electrode onto a substrate. A gaseous precursor is introduced into the reaction chamber at hyperbaric pressures, and the precursor decomposes at the electrode-heated zone to produce a solid deposit. If the electrode focus tracks, for example, backward, long fibers can be grown. More complex structures also may be created by continuously reorienting and scanning the electrode. Alternatively, an array of focused energy sources, such as laser beams or electrodes may be used to simultaneously fabricate many fiber-like substrates, which allows fabrication of complex 3-D electronic structures and devices. Diffractive optics, electro-optics, and/or lenslet arrays are often used to create many energy foci at once, and in this way, grow many fibers at once. The electrodes are oriented and scanned relative to the fibers to provide the desired growth directions.

During FE-HP-LCVD an electrode, or array of electrodes, as described in patent application Ser. No. 11/143,179, filed Jun. 2, 2005 and incorporated herein by reference, may be used in opposition to the growing structures (fibers), with an applied voltage between the fibers and electrodes to generate a high-pressure discharge in the gases between the fiber(s) and electrode(s). Field- and thermionic-emission from the fiber tip(s) facilitate this discharge. This allows specific gas-phase species to be generated and accelerated onto the fiber tips, which can influence the composition and structure of the deposit material. This is important for the generation of particular electronic material properties, e.g. dopant states and levels.

Previous work has described the use of HP-LCVD to create 3-D structures such as fibers from a single material. However, the creation of 3-D electronic components and devices presents far greater challenges and is non-intuitive. Electronic components typically comprise multiple elements, gradients from one element to another, junctions which must be a "clean break," and may have a complex geometry. The present invention demonstrates that at least some of these challenges have been met.

The present invention describes a novel method of manufacturing complex three-dimensional (3-D) micro- and nano-scale (i.e., typically larger than 300 nm) electronic structures and components. The method of the present invention grows insulators, semiconductors, and metallic conductors to form standard semiconductor microcircuits and novel, complex 3-D microsystems composed of semiconductors, metallic connections, and pathways. The method of the present invention may be used to grow small semiconductor crystals and doped conductive lines in the complex patterns and associations required for 3-D microelectronics, and the post-processing necessary for device activation. This method results in devices with unprecedented performance compared with those produced by other standard lithographic methods, and allows for their vertical integration.

The method of the present invention also yields a very efficient means of removing heat because it creates diodes, transistors, and conductive wires within 3-D fibers of silicon or other semiconductor materials. These materials and their devices can be embedded directly in a dielectric fluid that surrounds the active device elements, allowing immediate heat dissipation (i.e., an ultra heat sink). In essence, the device itself becomes the heat sink.

The method of the present invention may also allow miniaturization and integration of vacuum electronics, e.g., metallic conductors and waveguides for terahertz signals, and also micro-vacuum electronics devices such as micro-klystrons and micro-travelling wave tubes. These non-linear devices have many useful characteristics that are needed for communications, analog signal processing, power switching, and high speed computing. Through the process of the present invention, such devices can be integrated with semiconductor devices, and their reduced dimensions will allow low-voltage operation and ultra-high speed switching speeds (>1 THz), which ultimately could replace solid-state devices.

Finally, and perhaps most importantly, the present invention may be used to fabricate 3-D hybrid devices to form complex, highly interactive and efficient micro-systems that have been heretofore unrealized. For example, a system comprising micro-scale vacuum electronics, high-frequency electromagnetic devices, optoelectronics, and power-switching electronics can all be created with the present process, thus enabling hybrid systems to be fabricated. Presently, these devices are manufactured by disparate processes, and this has prevented their integration. Consider, for example, the creation of a triode amplifier, with a built-in solid state amplifier. Traditionally, the triode would be fabricated though machining, glass-blowing, application of coatings, and assembly, while the solid-state amplifier would be created in silicon or a similar semiconductor by lithographic methods. These would then need to be hand- or machine-assembled to create a final product, often on a circuit board with interconnects. The method of the present invention allows these two devices to be fabricated and interconnected by a single process—enabling their integration without assembly steps or circuit boards. This greatly reduces cost, labor, and materials—and makes previously unrealized products possible and economically-viable. One possible outcome of such hybrid devices, for example, would be a miniaturized micro-vacuum-tube-based terahertz terahertz oscillator with solid-state logic for applications such as high-data-rate communications or remote sensing.

The process of the present invention is very different than traditional lithographic approaches, where the substrate is formed first and must thereafter be modified through patterning, implantation, etching, metallization, and other methods. "Fiber-like substrates" grown by the present process are unusual in that the substrate itself is grown into desired patterns and orientations; different types of devices can be created within the same 3-D integrated circuit, not only by changing the material composition, but also its crystal structure. For example, different crystal orientations can be created, such as <100>, <111>, and others. Traditional lithographic methods cannot do this without patterning separate wafers and post-assembly. By growing the substrate and the devices simultaneously, new combination devices and materials can be created that were heretofore impossible without assembly.

One reason three-dimensional microelectronic devices have not been realized earlier is that single crystal silicon fibers are generally not available in large quantities commercially, as silicon is usually refined by the Czochralski Process in large ingots, and it is impractical to dice such ingots into the fiber-like geometries described above. It would also be impractical to manually assemble fibers into useful arrays from such diced ingots. Through the process of the present invention, however, hundreds and even thousands of pure silicon single-crystal fibers can be grown simultaneously. These fibers can be doped through the addition of small quantities of n- or p-type elements in the gas mixture. Even more complex semiconductor materials, e.g., SiC, diamond, graphene, GaN, MN, InP, etc., can be fabricated in this manner.

Hence, the process of the present invention performs the function of many traditionally separate processing steps as a single process, greatly reducing the number of processing steps and types of fabrication tools needed to create microelectronics. Although photolithographic methods excel at producing planar assemblies of integrated circuits, they usually require many mask exposures and process steps, often requiring realignment between steps. With the present process, however, device materials are essentially "auto-aligned" as they are grown, eliminating most of the alignment steps commonly required with lithographic processing. In addition, the number of discrete processes is greatly reduced; no longer are DUV steppers, pattern generators, spin coaters, reactive ion etchers, ion implanters, low-pressure CVD coaters, PVD coaters, wire bonders, etc. all required to fabricate and interconnect devices. The present process reduces the cost of microelectronics prototyping and fabrication by over 85%, where traditional ICs are not required.

The following describe some non-limiting embodiments of the present invention.

According to a first embodiment of the present invention, a method of fabricating a three-dimensional microelectronic structure is provided, comprising passing a first precursor material for a selected three-dimensional microelectronic structure into a reaction chamber at temperatures sufficient to maintain said precursor material in a predominantly gaseous state; maintaining said reaction chamber under sufficient pressures to enhance formation of a first portion of said three-dimensional microelectronic structure; applying an electric field between an electrode and said microelectronic structure at a desired point under conditions whereat said first portion of a selected three-dimensional microelectronic structure is formed from said first precursor material; positionally adjusting either said formed three-dimensional microelectronic structure or said electrode whereby further controlled growth of said three-dimensional microelectronic structure occurs; passing a second precursor material for a selected three-dimensional microelectronic structure into a reaction chamber at temperatures sufficient to maintain said precursor material in a predominantly gaseous state; maintaining said reaction chamber under sufficient pressures whereby a second portion of said three-dimensional microelectronic structure formation is enhanced; applying an electric field between an electrode and said microelectronic structure at a desired point under conditions whereat said second portion of a selected three-dimensional microelectronic structure is formed from said second precursor material; and, positionally adjusting either said formed three-dimensional microelectronic structure or said electrode whereby further controlled growth of said three-dimensional microelectronic structure occurs.

According to another embodiment of the present invention, a three-dimensional diode is provided, comprising a first portion of a wire comprising indium and silicon; a second portion of a wire comprising indium, tungsten and silicon, whereby the second portion of the wire is continuous with the first portion of the wire, and wherein the percentage of tungsten increases throughout the portion of the wire from 0 to 100 and creates an ohmic contact; a third portion of a wire comprising boron and silicon, wherein the third portion of the wire is continuous with the second portion of the wire, and wherein the interface of the third portion of the wire with the second portion of the wire is abrupt; a fourth portion of a wire comprising boron, indium and silicon, wherein the fourth portion of the wire is continuous with the third portion of the wire, and wherein the percentage of boron decreases from 100 to 0 and creates an ohmic contact; and, a fifth portion of a wire comprising indium and silicon, wherein the fifth portion of the wire is continuous with the fourth portion of the wire.

According to yet another embodiment of the present invention, an integrated three-dimensional microelectronic device is provided, comprising optoelectronic components, micro-vacuum electronic components, high-frequency electromagnetic wave components, or any combination thereof.

DETAILED DESCRIPTION

The present invention employs the use of field emission laser chemical vapor deposition (FE-LCVD), field-emission high-pressure laser chemical vapor deposition (FE-HP-LCVD), or alternatively high-pressure laser chemical vapor deposition (HP-LCVD), to form three-dimensional microelectronic structures, components and devices. One or more chemical precursors are evaporated into a chamber wherein one or more electrodes is focused. The chemicals decompose at the location where the electrode is focused, and a small structure, e.g., a fiber, is deposited. Such structures grow off the substrate where they were initiated, and can be continuously grown to substantial lengths, split into multiple branches, or joined with other fibers. Arrays, hierarchical and tree-like structures can be grown in three dimensions. Eventually, they can be grown to a sufficient length whereat the substrate has a lessened influence or no influence. In this manner, many diodes or transistors can be grown simultaneously in three dimensions. Diodes, transistors and other passive components (such as resistors, capacitors, and the like) form the basis for more complex switching, amplification, and memory circuits that are the foundation of modern electronics.

The process of the present invention can be used to grow many novel materials in the form of high-purity, single-crystal fibers, including semiconductor materials such as semiconductors, such as silicon (Si), gallium arsenide (GaAs), silicon carbide (SiC), as well as dielectrics, such as $SiO_2$ and $Ta_2O_5$. Through the addition of trace quantities of secondary precursors, these semiconductors can be doped to be n- or p-type, allowing microelectronic components such as diodes, transistors, and conductive wires to be created.

Gases are exchanged and/or modified in real-time to generate different materials for their electronic properties. To grow devices, the process changes the material being grown by exchanging process gases either abruptly or gradually. This creates either an abrupt change in deposited material (abrupt contact) or a graded material composition (gradient contact), respectively. Gases can also be purged and/or pumped away in preparation for other gases to be used.

Figure 3:
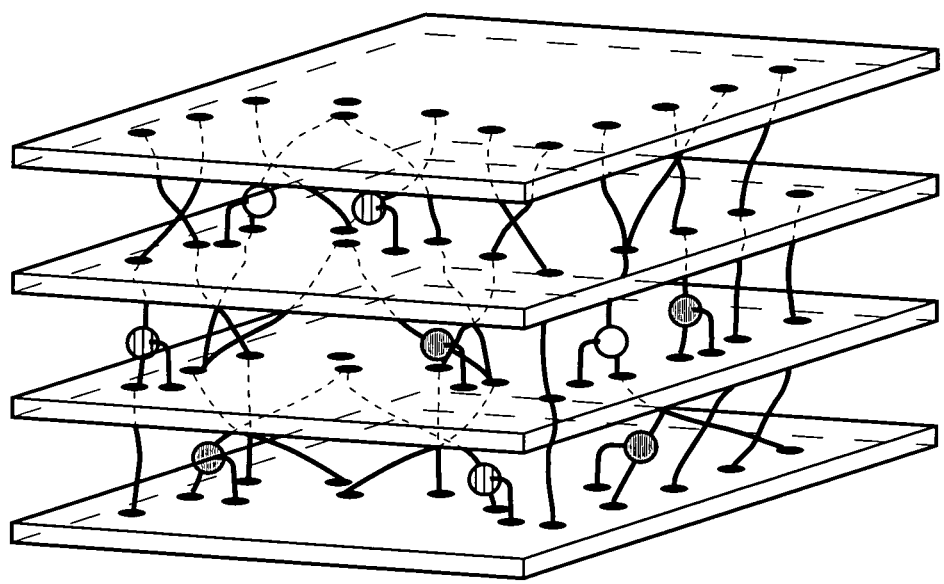
FIG. 3 shows an illustration of vertical integration of chipsets.

The process of the present invention presents a new approach for fabricating insulators, semiconductors, and metallic conductors to form standard solid-state microcircuits, metallic connections and pathways, and vertically integrated circuits (FIG. 3). Diodes, transistors, resistors, and other passive components can be grown in three dimensions and interconnected in circuits, networks and arrays. The fabrication method grows electronics in three-dimensions, rather than in traditional two-dimensional fashion on a substrate, allowing for vertical interconnection and integration of planar substrates into electronic "blocks" or micromodules. Vast improvements in device and system performance can be achieved through vertical integration of complex micromodules and devices. The present process combines all the advantages of a rapid prototyping technology with advanced microelectronics fabrication.

Herein, "three-dimensional" means a structure created and existing in a volume having an x, y and z component, as opposed to two-dimensional structures, understood to include, for example, components formed on two-dimensional substrates, such as silicon wafers.

Herein, "microelectronic structure" means a part, such as a three-dimensional wire, of a three-dimensional microelectronic component.

Herein, "microelectronic component" means a functioning three-dimensional electronic component, such as a transistor, diode, capacitor, etc.

Herein, "continuous" means that the portions of a wire connect seamlessly to form one continuous wire having differences in chemical composition.

Herein, "gradient contact" means that the transition between two different materials in, e.g., a wire, occurs gradually, with the concentration of a first material decreasing as the concentration of a second material proportionally increases.

Herein, "ohmic contact" means that the transition between two different materials in, e.g., a wire, results in a current-voltage (I-V) curve which is linear and symmetric.

Herein, "abrupt contact" means that the transition between two different materials in, e.g., a wire, occurs non-gradually, and at the interface between the two materials there is a clear transition from one material to another wherein substantially no intermingling of the first material(s) with the second material(s) occurs.

Herein, "integrated" means an electronic device in which a plurality of microelectronic components, optionally employing different base technologies (e.g., optoelectronics vs. micro-vacuum electronics), are connected directly with each other (for example, by means of a 3-D wire) and housed in a single 3-D structure.

Figure 1:
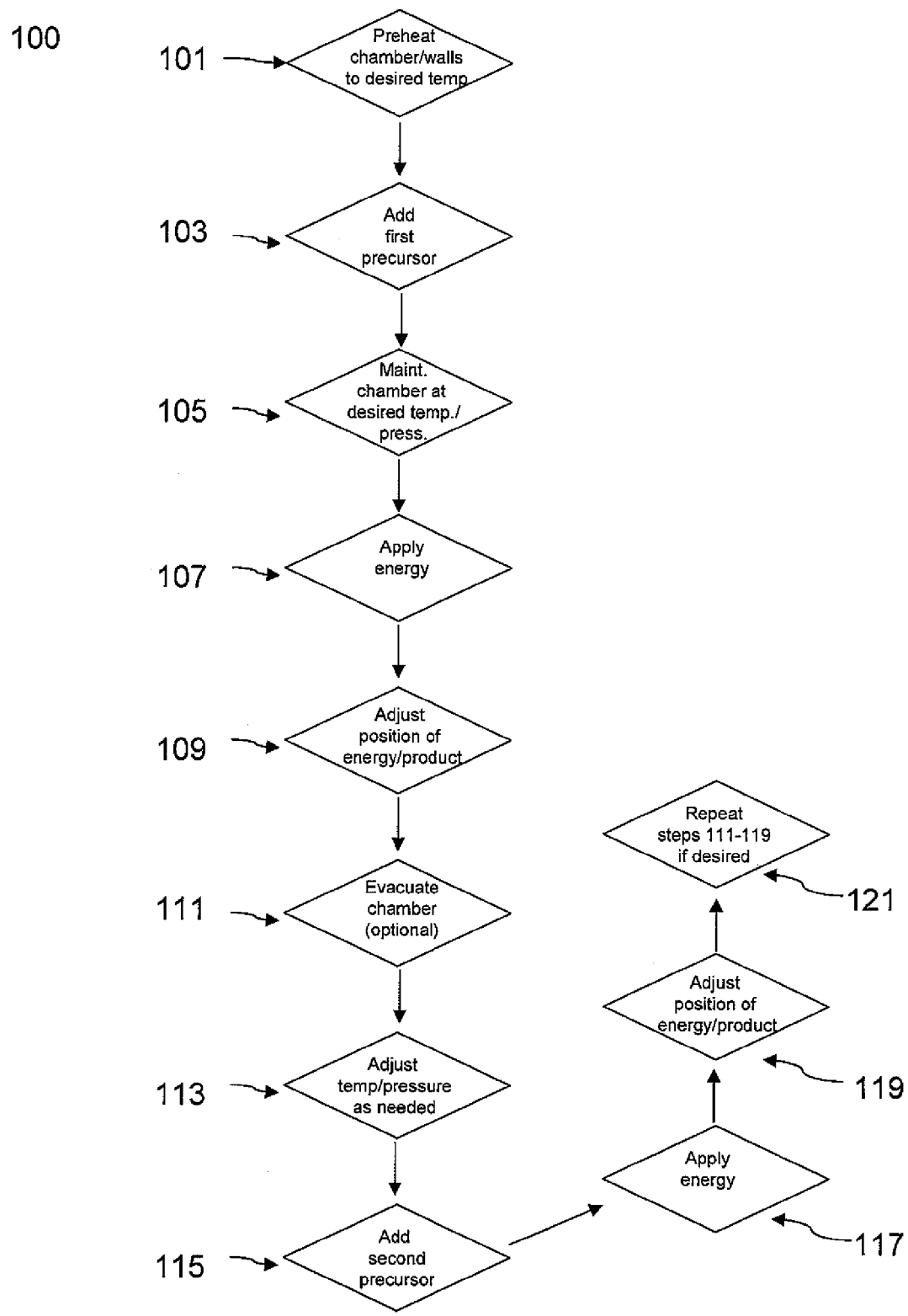
FIG. 1 shows a flow chart of depicting the steps of one embodiment of the present invention.

FIG. 1 shows a flow chart which depicts the steps of the present invention (100) according to one nonlimiting embodiment. First, the chamber and optionally the walls of the chamber are preheated to a desired temperature (101). Preheating of the chamber walls is useful to prevent condensation of materials. A first precursor material is introduced into the chamber (103). It is to be understood that "precursor material" encompasses both a single components and mixtures of components. In alternative embodiments, multiple precursor materials may be introduced sequentially or simultaneously (as in a mixture), provided the temperature and pressure conditions are suitable for each precursor. The precursor material may be introduced by a variety of means. In one embodiment, the material is pumped or injected into the chamber, upon which the chamber is sealed and introduction of material ceases. In one embodiment, the material is introduced by means of a nozzle, wherein the material is introduced locally at the place where growth occurs. An advantage of introducing precursor material by means of a nozzle or similar device is that this allows for faster transition between materials.

The chamber is maintained at the desired temperature and pressure for the duration of deposition of materials (105), and energy is applied (107). The energy may be applied by means of a laser or an electrode. For the purposes of the present invention, wherein FE-LCVD and/or FE-HP-LCVD are used, the energy is applied by means of an electrode. The growth of the material may be controlled by adjusting the position of the electrode and/or the growing material (109). The temperature and pressure are adjusted to conditions suitable for a second precursor material (113), which is then introduced into the chamber (115). An electrode is applied (117), and the position of the electrode and/or the growing material is adjusted to facilitate growth of the desired structure (119). Note that steps (111)-(119) may be repeated as often as necessary to result in a desired 3-D structure or component (121).

When the desired growth of the first material is completed, introduction of the precursor material is ceased. In one embodiment, the chamber may be evacuated of precursor material prior to introduction of a second precursor material (111). Note that "evacuating" is understood to include removal of precursor material by creating a vacuum, or by purging the chamber, e.g., with an inert material. When the chamber is not evacuated or purged, and a second precursor material is introduced, a gradual transition of materials in the microelectronic structure results, which may create, e.g., an ohmic contact. However, when an abrupt transition between materials is required, e.g., to create a diode contact, the chamber must be evacuated of substantially all of the first precursor material prior to introduction of subsequent materials. To ensure an abrupt transition, the tip of the three-dimensional microelectronic structure may be actively cleaned.

In one example of the present invention, Schottky diodes are grown by fabricating two fibers on top of each other. Initially, a thin fiber of boron-doped silicon (B—Si) is grown to a specified length. Then, by purging the deposition chamber and switching to a precursor of tungsten (W) or molybdenum (Mo), a second metallic fiber is deposited onto the B—Si fiber without ever exposing the substrate to air. In this manner, a clean interface is created between the B—Si fiber and the W or Mo fiber, and a Schottky junction is formed. Transistors can also be formed through the use of three successive fibers, with an interconnecting fiber.

The apparatus of the present invention is described in Maxwell et al., "Hyperbaric Laser Chemical Vapor Deposition of Carbon Fibers from the 1-Alkenes, 1-Alkynes and Benzene," J. Am. Chem. Soc. 2006, 128, 4405-4413, incorporated herein in its entirety. In the present process, the electrodes are focused into a chamber and, in the chamber, onto a core or mandrel. If a laser is used, examples of lasers suitable for use in the present invention include argon ion lasers (at 4881514 nm), Nd:YAG lasers (at 532/1064 nm), and Ytterbium fiber lasers (at 1070 nm). An adjustable nozzle introduces the gases, or precursors, such as silicon (Si), gallium arsenide (GaAs), and silicon carbide (SiC), into the chamber either sequentially or simultaneously, and the gases decompose at the laser-heated spots to produce solid fiber deposits. The partial pressures at which the precursors are introduced depend on the desired growth rates, compositions, and material properties of the deposit materials, and in theory have no upper limit (provided the desired vapor pressures for each precursor can be achieved). For the purposes of the present invention, the pressure of the chamber may be in the range of from about 0.01 atm to about 10 atm, and in one embodiment is from about 1 atm to about 3 atm.

If the electrodes are stationary, the fibers will grow into the beams along the axis. When the focused laser spots are drawn backward, the fibers follow and long fibers are grown. Depending on the type of precursor used, semiconductors, such as silicon (Si), gallium arsenide (GaAs), silicon carbide (SiC), and others, can be grown as single crystals. Through the addition of trace quantities of secondary precursors, the semiconductor can be doped to be n- or p-type, allowing microelectronic structures and components such as diodes, transistors, and conductive wires to be created. Three-dimensional Schottky diodes have been grown in this fashion, beginning with indium doped silicon wires, growing boron-doped silicon in contact with tungsten, and then continuing the growth of In-doped Si wires, by changing the gases as the fibers were grown. Thus through the addition of trace quantities of other materials, the fibers can be doped to produce diodes, transistors, and conductive wires. These devices are "self-aligned" along the electrode, growing where the electrode is focused. By changing the orientation of the electrodes as the devices are grown, electronic devices can be fabricated in any desired pattern, and large arrays of devices can be created simultaneously.

By changing the gas compositions abruptly, different materials can be grown on top of each other, forming heterojunctions (interfaces between two layers of dissimilar crystalline semiconductors). semiconductors/metals). In this case, cleanliness of the surface and elimination of native oxides is very important for proper device function, and since the junction formation is performed in-situ, oxides can be prevented through the use of ultra-high purity gases and the addition of oxygen/$H_2O$ scavenging gases or oxide etchant gases (e.g. hydrogen fluoride). If needed, an intermediate step may be used to etch/remove any native oxides or contaminants from the first heterojunction material before applying the second material. As the laser (and electrode) is already aligned with the device material, this can be performed simply through laser heating, laser chemical etching, pulsed laser ablation, or application of an electric field between the electrode and fiber. This is an important advantage of this process, as the junction can be kept clean and oxides/contaminants removed very easily (as a variant of the process itself). Subsequent device activation is performed by passing high-temperature gases past the 3-D fibers or by laser heating.

Figure 2:
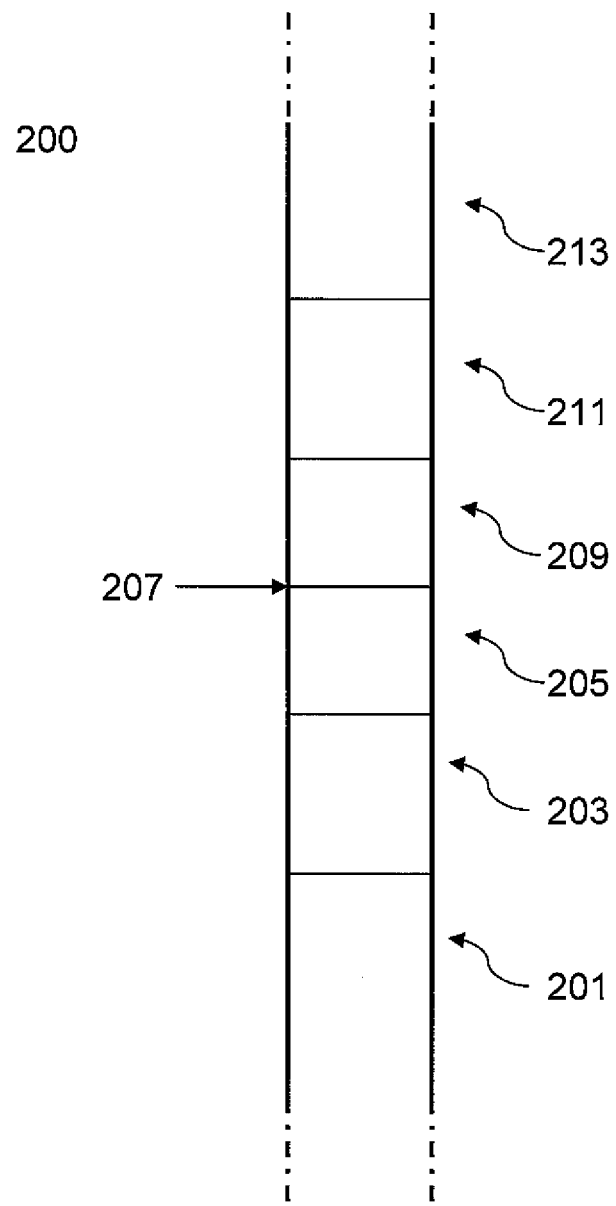
FIG. 2 depicts a schematic illustration of a 3-D diode grown with the process of the present invention.

FIG. 2 depicts one example of a 3-D microelectronic component of the present invention. A Schottky diode (200) was produced as follows. A first precursor material (201) is deposited, comprising, for example, indium and silicon, in the form of a wire. Tungsten is gradually introduced into the precursor material mixture, to produce a portion of the wire which comprises In—W—Si, wherein the concentration of W forms a gradient (203), and thus an ohmic contact between the In—Si portion of the wire (201) and a portion of the wire consisting essentially of W (205). The chamber is evacuated, and a third precursor material is introduced, which comprises, e.g., boron and silicon. The B—Si is deposited onto the tungsten portion of the wire (205) such that an abrupt transition (diode) (207) is created between the W and the B—Si. B—Si continues to be deposited so as to form a B—Si portion of the wire (209). Indium is gradually introduced into the precursor material mixture, and the concentration gradually increased to form a portion of the wire comprising a B—In—Si (211), wherein the concentration of In forms a gradient, and thus an ohmic contact between the B—Si portion (209) and a terminal portion of the wire (213) which consists essentially of In—Si. The wire may be continued indefinitely beyond portions (201) and (213), and may be connected to other microelectronic structures or components. Optionally, a resistor or other electronic component (215) may be connected such that the formed circuit spans the abrupt transition (207). All this is performed using the same process, simply by changing process gases and laser powers in real-time.

The growth of Schottky diodes, transistors, capacitors, and inductors using hyperbaric laser chemical vapor deposition has been demonstrated. Single crystal silicon fibers were grown as three-dimensional substrates, and this silicon was doped to produce n- and p-type materials. Other parts of the silicon substrate were also highly doped with metals to produce conductive lines and ohmic contacts, so that complete devices were fabricated.

FIG. 3 shows an illustration of arrays of power electronics devices created in 3-D using the process of the present invention. Benefits of three-dimensional power electronic devices created in this manner include, for example, a decrease in the capacitance of the device and an increase in thermal dissipation, since the devices can act as "cooling fins." At sufficiently small dimensions, the convection from a heated wire is enhanced (that is, the Nusselt number approaches zero and the heat transfer coefficient approaches infinity), such that orders of magnitude improvements in heat transfer can occur from a wire to its surroundings. This is generally termed "thin-wire convection" and is commonly used in sensors. A transistor formed from a 3 micron diameter wire may transfer many watts of power to its surroundings, just with natural convection in a helium or hydrogen atmosphere. However, the geometry described in the present invention may be especially conducive to forced flow convection cooling, and in that case, very small wires could dissipate hundreds of watts. In addition to power electronics benefitting from this approach, high density circuits also would benefit from increased dissipation of heat.

One advantage of the 3-D fabrication process of the present invention for designing and fabricating semiconductor power electronic devices can be seen by examining the convective heat transfer from a thin cylindrical wire. The heat transfer coefficient, H, is related to the heat convected away, Q, by:

$$Q = A*H*T,$$

where A is the surface area and T is the difference in temperature between the heated surface and its surrounding medium. The heat transfer coefficient also depends on the Nusselt number, Nu, the conductivity of the surrounding medium, k, and the radius of the fiber, r, as:

$$H = Nu*k/(2r)$$

and, for a given surface geometry, the Nusselt number is a function of the form:

$$Nu = C + F(Gr, Pr),$$

where C is a constant, and Gr and Pr, are the Grashoff and Prandtl numbers, respectively. At very small fiber diameters, however, the Nusselt number approaches a constant, irrespective of the functional portions of Gr or Pr. For a small cylindrical fiber, where the boundary layer thickness is greater than the diameter of the fiber, this constant is approximately 0.36. As a result, the heat transfer coefficient simply becomes proportional to $(1/r)$. This is known as "thin wire convection."

Ultimately, this means that as the fiber becomes smaller, its ability to transfer heat (Q) to its surroundings grows exponentially, provided its surface area is maintained constant. Thus, an ultimate heat sink is a very thin wire, whose surface is modulated (varied along the length or ribbed) and textured to provide a large surface area over a very small volume. This can be accomplished with the process of the present invention as a fiber grows by changing (1) the incident laser power, (2) the gas pressures/flow rates, or (3) changing the concentration of precursor gases within a carrier gas in real-time. The periodic, ribbed fiber of FIG. 7(b) was created by varying the laser power sinusoidally as the fiber grew outward.

By embedding electronic devices directly within wires, conduction through layers of solid materials or a substrate no longer plays a significant role in the heat transfer, and the heat dissipation is limited only by the rapid rate of thin wire convection. In this way, the amount of heat removed from an electronic device can be increased by 100 to 10,000 times over current technologies—and even more if the surrounding cooling medium is forced past the wire at a rapid rate, or if phase-change cooling media are employed—to allow boiling heat transfer. Additionally, small "fiber fins" can also be grown at right angles to the primary "fiber substrate" around the device to further enhance the surface area for heat dissipation (see FIG. 8).

Figure 4:
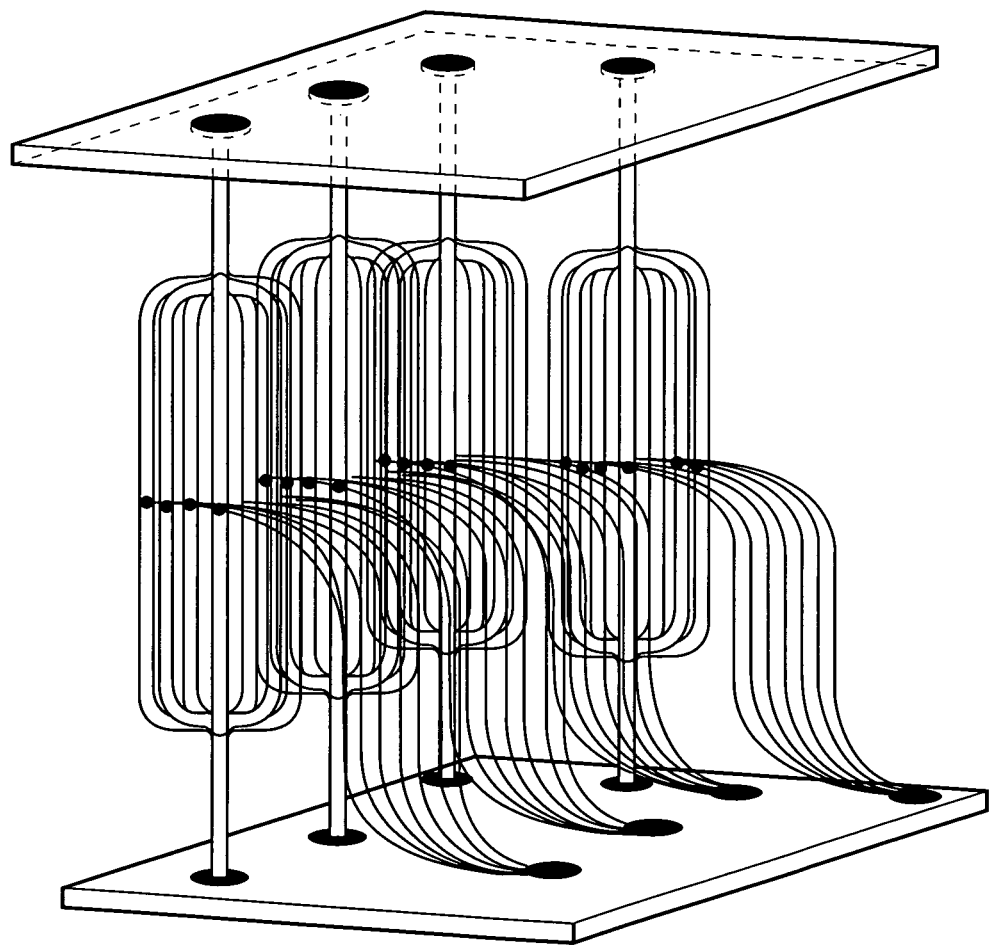
FIG. 4 shows an illustration of arrays of power electronics devices created in 3-D using the process of the present invention.
Figure 5:
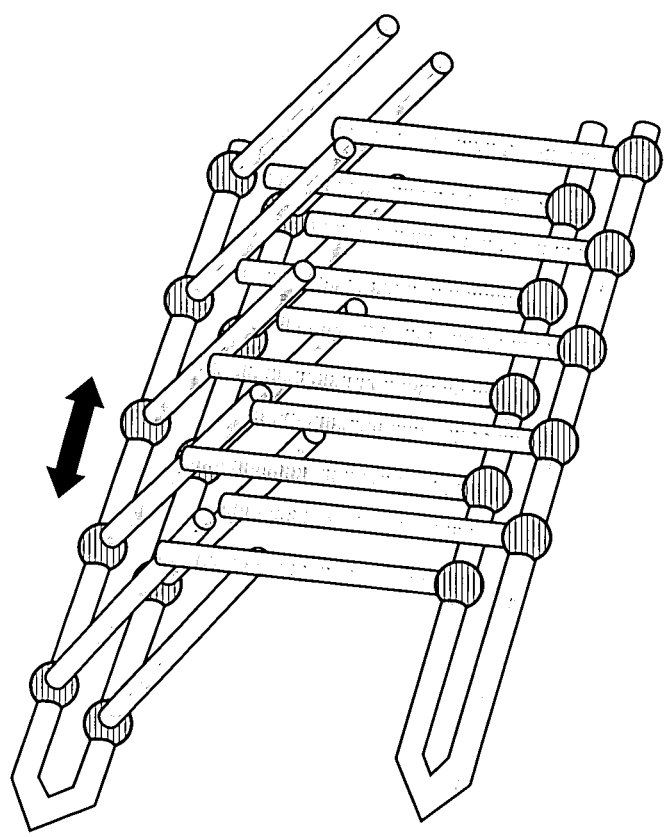
FIG. 5 shows massively-parallel relay contacts for significant improvement of relay current-carrying capability.

Single crystal silicon fibers are generally not available in large quantities commercially, as silicon is usually refined by the Czochralski Process in large ingots, and it is impractical to dice such ingots into the fiber-like geometries described above. It would also be impractical to manually assemble fibers into useful arrays from such diced ingots. Through the process of the present invention, however, hundreds and even thousands of pure silicon single crystal fibers can be grown simultaneously. These fibers can be doped through the addition of small quantities of n- or p-type elements in the gas mixture. Even more complex semiconductor materials, e.g., SiC, diamond, graphene, GaN, AlN, InP, etc., can be fabricated in this manner. FIG. 4 shows an illustration of arrays of power electronics devices created in 3-D using the process of the present invention. Using the advanced heat sink capability, power electronics performance and reliability can be increased.

The process of the present invention may greatly impact opto-electronics fabrication and integration, as optical fibers and optoelectronic devices can be grown as readily as Si-based conductive fibers. The present invention may provide the ability to grow arrays of self-aligned fiber lasers with integrated beam splitters, gradient-index lenses, pump beams, LEDs, and semiconductor sensors, all grown using the process in a self-aligned and continuous manner. The ability to grow many materials and integrate them in-real time, allows a level of opto-electronics and microelectronic device integration not previously realized.

Additionally, it is well known that common power relays (such as those with two contactor plates), essentially touch at three points when fully-closed, and these points can be relatively small in physical extent compared to the overall size of the plates (10-100 micron areas are typical). When switching large amounts of power (current) at even moderate voltages, arcing can occur when these contact points are pulled apart (or when they close). Much greater current carrying capacity would be possible if more contactor points were actually available over the entire surface area of the parallel plates. The process of the present invention provides a method of fabricating many fiber-sets, where instead of rigid parallel plates common in metallic relays, an array of individual fibers comes into contact with an opposing set of fibers, and each fiber is flexible, so that all fiber sets come into contact and remain in contact when the contactor is closed. In this way, hundreds, even thousands, of contact points are made available—multiplying the current carrying capacity of a relay by 2-3 orders of magnitude.

The process of the present invention greatly excels in high-end semiconductor devices that require significant power dissipation, fast speeds, high-density circuits, high voltages, or heterojunctions (the interface that occurs between two layers or regions of dissimilar crystalline semiconductors) made from unique materials.

The process of the present invention provides a means to prototype microelectronics at reduced cost. It eliminates many processes, eliminates most alignment steps, adds the third dimension, enables new materials, enables novel devices, and allows these devices to be integrated into hybrid systems. It complements lithographic methods by providing a flexible method of interconnecting traditional ICs into 3-D packages. It ultimately allows for increased packaging density, reduced material waste, reduced packaging, better cooling and heat management, and improved system performance. Finally, it provides a means to develop and implement many new devices and systems that have yet to be discovered. By using many focal spots at once, many devices can be created simultaneously—so the production rate can be suitable for the automated manufacture of entire systems thereby reducing the cost, manufacturing complexity, and enabling increased product adoption in the marketplace.

The process of the present invention fabrication technique will also allow fully automated and flexible fabrication of micro-vacuum electronics, similar to the revolution in semiconductor devices' miniaturization that occurred using lithography. Devices that can be fabricated using the process of the present invention include vacuum electronics at the micro/nano scale such as micro-magnetrons, micro-klystrons, oscillators, amplifiers, thermionic cathodes, hollow cathode devices, e-beam and ion-beam sources, and micro travelling wave tubes (TWTs). These can be created through the fabrication of electrodes, field emitters, microtubes, and interconnects. For example, a triode could be fabricated by (1) growing three electrodes, (2) growing a sacrificial large fiber around these electrodes that forms the inside surface of the microtube, (3) coating the sacrificial fiber, and then (4) etching away the sacrificial fiber through a hole in the substrate or coating. Another example: waveguides can be created though the growth of sacrificial fibers that can be coated or embedded in a matrix material. The sacrificial fibers are then selectively etched to create a arrays of free-standing or embedded microtubes.

The process of the present invention may also be applied to the field of terahertz technology. Terahertz technology and its applications are growing rapidly. In the electromagnetic spectrum, the terahertz region is nestled between the millimeter and far infrared bands, roughly between 300 GHz and 10 THz. These frequencies correspond to wavelengths between 1000 m and 30 m. Terahertz devices are now being applied to medical imaging such has teeth and soft tissue 2-D and 3-D scans where the short wavelength allows greater detail and significant advantages over X-ray or other techniques.

To illustrate an example of 3-D structures that can be developed using the process of the present invention, terahertz compatible rectangular micro-waveguides can be fabricated (300-m wide by 150-m high), allowing containment and propagation of signals above 500 GHz. Using the process of the present invention, circular waveguides can be grown that allow signals above 586 GHz. Circular waveguides can offer some advantages in terms of polarization and structure. Additionally, cylindrical resonant cavities, those used for filtering and signal detection, can be fabricated with resonant frequencies above 765 GHz assuming an inner radius of 150 m. This is the lowest frequency of the device. Due to the nature of the cavity, much higher frequencies in the THz range can be generated. Finally, it should be noted that vacuum electronics generate heat from scattered electrons and radiative/conductive losses. Very often refractory materials are required for some elements to prevent melting, and again, the capacity of the tube is usually limited by the maximum temperatures that the device materials can withstand. By making vacuum devices miniature, e.g., in the profile of a fiber, the devices can be more rapidly cooled, while at the same time allowing greater speed with reduced voltages.

Another emerging terahertz application is in space-based communications. In the upper reaches of the atmosphere, and out into space, terahertz signals propagate well with little attenuation, and because of the short wavelength, can be tightly focused with relatively small antennas. These attributes make terahertz communication very attractive for high-bandwidth, secure point-to-point communications. However, the dominant factor limiting successful adoption of THz technology in this application is the need for higher-power terahertz sources. At these frequencies, there is substantial difficulty in developing oscillators, filters, detectors and amplifiers. On the one hand, the frequency is too high for solid-state devices limited by stray capacitance and charge transit times and mobility lifetimes. On the other hand, the frequency is too low a frequency for traditional optical devices such as laser diodes and other optical sources and components. The process of the present invention fabrication technique will allow fully automated and flexible fabrication of micro-vacuum electronics, similar to the revolution in semiconductor devices' miniaturization that occurred using lithography. Devices that can be fabricated using the process of the present invention include vacuum electronics at the micro/nano scale such as micro-magnetrons, micro-klystrons, oscillators, amplifiers, thermionic cathodes, hollow cathode devices, e-beam and ion-beam sources, and micro travelling wave tubes (TWTs).

To illustrate an example of 3-D structures that can be developed using the process of the present invention, terahertz compatible rectangular micro-waveguides can be fabricated (300-m wide by 150-m high), allowing containment and propagation of signals above 500 GHz. Using the process of the present invention, circular waveguides can be grown that allow signals above 586 GHz. Circular waveguides can offer some advantages in terms of polarization and structure. Additionally, cylindrical resonant cavities, those used for filtering and signal detection, can be fabricated with resonant frequencies above 765 GHz assuming an inner radius of 150 m. This is the lowest frequency of the device. Due to the nature of the cavity, much higher frequencies in the THz range can be generated. Finally, it should be noted that vacuum electronics generate heat from scattered electrons and radiative/conductive losses. Very often refractory materials are required for some elements to prevent melting, and again, the capacity of the tube is usually limited by the maximum temperatures that the device materials can withstand. By making vacuum devices miniature, e.g., in the profile of a fiber, the devices can be more rapidly cooled, while at the same time allowing greater speed with reduced voltages.

With the emergence of new terahertz applications in astronomy and remote sensing, new detectors are needed to detect and map spectral energy from the universe. Integrated detectors that incorporate several types of technologies such as very-high-frequency (x-ray, ultraviolet, and terahertz sources and components) and optoelectronic devices can be fabricated within a single integrated system using the process of the present invention. The process will allow fully automated and flexible fabrication of micro-vacuum electronics, similar to the revolution in miniaturization of semiconductor devices that occurred when lithography eliminated the need for assembly of components. The present invention provides advantages over lithographic and micromachining methods because both insulators and metal structures can more easily be incorporated within the same framework.

Most importantly, the process of the present invention can grow and integrate next-generation devices such as optoelectronics, micro-vacuum electronics, and high-frequency electromagnetic wave (e.g., micro-/millimeter and terahertz) electronics all within a single platform. For example, silicon photodectectors can be grown into the end of fiber-optic devices, and three-dimensional micro-vacuum electronics can be grown, miniaturized, and integrated into systems such as very-large-scale integrated (VLSI) computing electronics or integrated computer chips. Finally, the process of the present invention offers the ability to vertically interconnect planar "chips" by growing 3-D conductive fibers (signal and power pathways) between the chips and fabricating them into vertical "blocks" (see FIG. 3). For example, these interconnects can be created using transparency of the chips at particular infrared wavelengths (illuminated through one wafer and focused on the next). The process of the present invention can be used to grow many novel materials in the form of high-purity, single-crystal fibers, including semiconductor materials such as Si, SiC, and Ge. To create microelectronics, the present process grows semiconductor fibers that are doped during growth to produce n- and p-type regions and conductive lines. For different materials, the present process changes the material being grown by exchanging process gases in real time. This process is very different than traditional lithographic approaches, where the substrate is formed first and must thereafter be modified through patterning, implantation, etching, metallization, and other methods. By growing the substrate and the devices simultaneously, new devices and materials can be created that were heretofore impossible.

The process of the present invention performs the function of many traditionally separate processing steps as a single process, greatly reducing the number of processing steps and types of fabrication tools needed to create microelectronics. Although photolithographic methods excel at producing planar assemblies of integrated circuits, they usually require many mask exposures and process steps, often requiring realignment between steps. With the present process, however, device materials are essentially "auto-aligned" as they are grown, eliminating most of the alignment steps commonly required with lithographic processing. In addition, the number of discrete processes is greatly reduced; no longer are DUV steppers, pattern generators, spin coaters, reactive ion etchers, ion implanters, low-pressure CVD coaters, PVD coaters, wire bonders, etc. all required to fabricate and interconnect devices. The present process reduces the cost of microelectronics prototyping and fabrication by over 85%, where traditional ICs are not required.

Fiber substrates grown by the present process are unusual in that the substrate itself is grown into desired patterns and orientations; different types of devices can be created within the same 3-D integrated circuit, not only by changing the material composition, but also its crystal structure. For example, different crystal orientations can be created, such as <100>, <111>, and others. Traditional lithographic methods cannot do this without patterning separate wafers and post-assembly.

The impact by the process of the present invention on specific segments of the microelectronics industry will be tremendous. By integrating ICs into 3-D packages, for example, the present process can greatly reduce the size of packaging and circuit boards (by over 75%). By allowing the creation of hybrid devices, otherwise incompatible technologies can be integrated together, allowing, for example, optical fibers to be integrated with solid-state devices directly along a single set of fibers. Such integration reduces the number of costly connectors required to create OEM devices/systems.

The present process will also greatly impact the power electronics industry, where heat management often dominates the size and cost of electronic packages. For example, the present process can grow and fabricate vertically-aligned power semiconductors (devices such as power MOSFETS) with current/power capacities of from about 10 to about 100 times that of standard semiconductor fabrication techniques, and this can be done in much smaller packages by dissipating the excess heat immediately away from the devices by thin wire convection. Finally, the present process offers a means to miniaturize (and integrate) vacuum electronics, optoelectronics, and ultra high-frequency electromagnetic wave electronics. These devices have heretofore been difficult to miniaturize and incorporate directly into Si-based packages because of their complex three-dimensional construction and differing materials requirements.

The process of the present invention can be envisioned to have applications in the preparation of articles in the following areas: high-power microelectronic circuits; data/telecommunications microelectronic circuits; photo transistors and optoelectronics; sensors; RF electronics; and, nano-scale electronics.

Some aspects of the process of the present invention were described by Maxwell et al., in "Growth of normally-immiscible materials (NIMs), binary alloys, and metallic fibers by hyperbaric laser chemical vapor deposition" Applied Physics A-Materials Science & Processing, vol. 91, issue 3, pp. 507-514 (June 2008), such article incorporated herein by reference in its entirety.

EXAMPLES

Example 1

Tungsten Fibers

Several dozen pure tungsten fibers were grown using $WF_6$+$H_2$ or $WCl_6$+$H_2$ gas mixtures. $WF_6$+$H_2$ proved to be the superior precursor system for both growth rates and lack of deposit impurities. Even at hyperbaric pressures, the kinetics of $WCl_6$+$H_2$ deposition was very slow. Using $WF_6$+$H_2$, very rapid steady-state growth rates were obtained, ranging from 3-160 μm/s. Typical gas mixtures were 3:1 $H_2$ to $WF_6$, and a cw Ar+ laser was used at laser powers from 400 mW to 12 W. The purity of the deposit was examined by energy dispersive X-ray spectroscopy (EDS) and Auger spectroscopy. Essentially no trace of fluorine was detected in the deposits, and only a thin native oxide was present, due to exposure to air prior to characterization. The microstructures of the fibers varied greatly, depending on the precursor pressures and laser powers employed. At $WF_6$ partial pressures of 350 mbar and laser powers of 800-900 mW, the fine tungsten fibers grew as highly-oriented single-crystals of square cross-section. These crystals were oriented in the (100) direction, as confirmed by X-ray diffraction. With accurate focal tracking, such crystals could be continued indefinitely at axial rates of 2-4 μm/s. As the partial pressure of $WF_6$ increased, however, the fibers became steadily more polycrystalline, beginning at the periphery of the reaction zones (behind the fiber tips) where the temperatures were the lowest. At approximately 700 mbar, the fiber cores remained crystalline; however, the outer fiber "skins" had become polycrystalline with 3-4 μm grains. At $WF_6$ partial pressures of 1500 mbar and above, however, the crystalline core completely disappeared, and the entire cross-section became polycrystalline with maximum grains sizes on the order of 3 μm. Fine 20-25 μm diameter fibers could be grown at the lowest laser powers (<650 mW). Grain sizes continued to drop with increasing pressures up to 3 bar—the limit of the HP-LCVD apparatus used for this experiment. These tungsten fibers are used to create electrodes for vacuum electronic devices, such as the triode described previously. Such electrodes are enclosed within microtubes as has also been described.

Example 2

Schottky Diode

A three-dimensional Shottky diode was fabricated as follows. An indium-doped silicon fiber was grown using as precursors materials for indium trimethylindium ($(CH_3)_3In$) and cyclopentadienylindium ($C_5H_5In$) and as precursor materials for silicon silane ($SiH_4$) and disilane ($Si_2H_6$). To achieve sufficient conductivity of the silicon single-crystals, the concentration of indium precursors in the gas phase may be less than 1000 ppm. The chamber pressure ranged from 600-1200 torr, and a cw Nd:YAG laser was used at laser powers from 200 mW to 3 W. An electrode also could be used to impart comparable energy, as would be understood by one of skill in the art.

The quantity of indium was slowly decreased, while adding very small quantities of boron (<1 torr) by means of a boron precursor. Suitable boron precursors include among others diborane, trimethylboron, triethylboron, triphenylboron, and decaborane. The slow addition of boron creates a boron-doped section in the silicon crystal with an ohmic contact to the indium doped silicon fiber. Note that the boron dopant level is important, as this determines the electrical properties of the Schottky diode. Note also that other n-type dopants may be used, such as aluminum, gallium, and others that would be readily known to one of skill in the art.

The deposition was stopped abruptly, the chamber immediately evacuated, and purged with an inert gas multiple times to remove all residual precursor materials. The chamber was pre-heated to 250° C. to remove precursors from the walls, while the sample was kept under a flow of clean, warm inert gas.

When the chamber was clean, a tungsten precursor, (e.g., $WF_6+H_2$), was introduced into the chamber and used to grow a single crystal of tungsten on the boron-doped silicon fiber through reduction of $WF_6$. This was done at the lowest possible temperature in order to prevent diffusion of the boron at the silicon interface. Once the tungsten crystal was sufficiently long, it was gradually transitioned into an indium-doped silicon fiber by gradually changing to In—Si precursors, as described above. This creates an ohmic contact, rather than a diode, at the W:In—Si transition (see FIG. 2).

There are many possible combinations of materials that could be used to create a three-dimensional diode, transistor, or triode. These examples are provided to show feasibility of the approach and are not all-inclusive.

Example 3

A hybrid three-dimensional micromechanical spring assembly, electrical coil, and electrodes were fabricated as follows: A supporting fiber was grown of carbon from ethylene. A soft mechanical spring was created of hydrogenated diamond-like carbon from ethylene and hydrogen. The growth rates were 15-20 microns per second, and the laser power was approximately 300-400 mW. Probes and coils were fabricated of carbon and tipped/coated with proprietary metals. This assembly was only 2-3 mm long, and functioned as a rudimentary accelerometer that responds to frequencies down to about 25 Hz.

In all embodiments of the present invention, all percentages are by weight of the total composition, unless specifically stated otherwise. All ratios are weight ratios, unless specifically stated otherwise. All ranges are inclusive and combinable. The number of significant digits conveys neither a limitation on the indicated amounts nor on the accuracy of the measurements. All numerical amounts are understood to be modified by the word "about" unless otherwise specifically indicated.

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

Whereas particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method of fabricating a three-dimensional microelectronic structure comprising:
    passing a first precursor material for a selected three-dimensional microelectronic structure into a reaction chamber at temperatures sufficient to maintain said precursor material in a predominantly gaseous state;
    maintaining said reaction chamber under sufficient pressures to enhance formation of a first portion of said three-dimensional microelectronic structure;
    applying an electric field between an electrode and said microelectronic structure at a desired point under conditions whereat said first portion of a selected three-dimensional microelectronic structure is formed from said first precursor material;
    positionally adjusting either said formed three-dimensional microelectronic structure or said electrode whereby further controlled growth of said three-dimensional microelectronic structure occurs;
    passing a second precursor material for a selected three-dimensional microelectronic structure into a reaction chamber at temperatures sufficient to maintain said precursor material in a predominantly gaseous state;
    maintaining said reaction chamber under sufficient pressures whereby a second portion of said three-dimensional microelectronic structure formation is enhanced;
    applying an electric field between an electrode and said microelectronic structure at a desired point under conditions whereat said second portion of a selected three-dimensional microelectronic structure is formed from said second precursor material; and,
    positionally adjusting either said formed three-dimensional microelectronic structure or said electrode whereby further controlled growth of said three-dimensional microelectronic structure occurs.

2. The method of claim 1, wherein the second precursor material is passed into the reaction chamber in a manner which results in a gradient contact between the first precursor material and the second precursor material.

3. The method of claim 1, wherein the second precursor material is passed into the reaction chamber in a manner which results in an ohmic contact between the first precursor material and the second precursor material.

4. The method of claim 1, wherein the pressure is from about 0.01 atm to about 10 atm.

5. The method of claim 1, wherein the electric field is applied to the microelectronic structures at a plurality of desired points in the reaction chamber by means of an array of electrodes, under conditions whereat a plurality of portions of one or more three-dimensional microelectronic structures is simultaneously formed.

6. The method of claim 1, further comprising the step of heating the walls of the reaction chamber to a desired temperature prior to passing the first precursor material into the reaction chamber.

7. The method of claim 1, wherein the first and the second precursor materials are passed into the reaction chamber by means of a nozzle.

8. The method of claim 1, wherein the first precursor material and the second precursor material form a p-n junction having an abrupt contact.

9. The method of claim 1, wherein the first precursor material and the second precursor material form a Schottky junction having an abrupt contact.

10. The method of claim 1, further comprising adding a dielectric material between the first precursor material and the second precursor material.

11. The method of claim 1, wherein the first precursor material and the second precursor material form an abrupt ohmic contact.

12. The method of claim 1 wherein said three-dimensional microelectronic structure is a diode.

13. The method of claim 1, further comprising the step of evacuating the reaction chamber of the first precursor material prior to passing a second precursor material into the reaction chamber.

14. The method of claim 13, further comprising the step of cleaning the tip of said three-dimensional microelectronic structure prior to passing a second precursor material into the reaction chamber.

15. The method of claim 1, wherein the first precursor material is an n-doped semiconductor and the second precursor material is selected from the group consisting of a p-doped semiconductor, a metal, and combinations thereof.

16. The method of claim 15, wherein the metal is selected from the group consisting of tungsten, molybdenum and combinations thereof.

17. The method of claim 1, wherein the second precursor material is in contact with a substantial portion of the first precursor material.

18. The method of claim 17, wherein at least one additional precursor material is in contact with a substantial portion of the second precursor material, to form a capacitor.

19. The method of claim 1, further comprising:
(a) passing at least one additional precursor material for a selected three-dimensional microelectronic structure into a reaction chamber at temperatures sufficient to maintain said precursor material in a predominantly gaseous state;
(b) maintaining said reaction chamber under sufficient whereby at least one additional portion of said three-dimensional microelectronic structure formation is enhanced;
(c) applying an electric field between an electrode and said microelectronic structure under conditions whereat for said at least one additional portion of a selected three-dimensional microelectronic structure is formed from said at least one additional precursor material;
(d) positionally adjusting either said formed three-dimensional microelectronic structure or said electrode whereby further controlled growth of said three-dimensional microelectronic structure occurs; and,
(e) repeating steps (a)-(d) to form at least one three-dimensional microelectronic component.

20. The method of claim 19, wherein the first precursor material forms a gradient contact with the second precursor material, and wherein the second precursor material forms a gradient contact with an additional precursor material which is the same as the first precursor material, to form a resistor.

21. The method of claim 19 wherein said three-dimensional microelectronic structure is a transistor.

22. The method of claim 19, further comprising fabricating at least one additional three-dimensional microelectronic component, and electrically connecting the microelectronic components to form a functional, integrated electronic device.

23. The method of claim 22, further comprising fabricating at least one additional functional integrated electronic device and electrically connecting the integrated electronic devices.

* * * * *